United States Patent [19]

Morrison, Jr.

[11] Patent Number: 4,724,058
[45] Date of Patent: Feb. 9, 1988

[54] METHOD AND APPARATUS FOR ARC EVAPORATING LARGE AREA TARGETS

[75] Inventor: Charles F. Morrison, Jr., Boulder, Colo.

[73] Assignee: Vac-Tec Systems, Inc., Boulder, Colo.

[21] Appl. No.: 640,353

[22] Filed: Aug. 13, 1984

[51] Int. Cl.⁴ .............................................. C23C 14/22
[52] U.S. Cl. ......................... 204/192.38; 118/50.1; 118/723; 204/298; 427/37; 427/47
[58] Field of Search ............. 204/192 R, 298, 192.38; 118/50.1, 723; 219/123; 427/37, 47

[56] References Cited

U.S. PATENT DOCUMENTS

| | | | |
|---|---|---|---|
| 3,625,848 | 12/1971 | Snaper | 204/192.38 |
| 3,783,231 | 1/1974 | Sablev et al. | 219/123 |
| 3,878,085 | 4/1975 | Corbani | 204/298 |
| 3,956,093 | 5/1976 | McLeod | 204/192.12 |
| 4,265,729 | 5/1981 | Morrison, Jr. | 204/298 |
| 4,356,073 | 10/1982 | McKelvey | 204/192.12 |
| 4,430,184 | 2/1984 | Mularie | 204/192 R |
| 4,512,867 | 4/1985 | Andreev et al. | 204/298 |
| 4,600,489 | 7/1986 | Lefkow | 204/192.12 |
| 4,673,477 | 6/1987 | Ramalingam et al. | 204/192.38 |

FOREIGN PATENT DOCUMENTS 363375 1/1979 U.S.S.R. .................. 427/37

OTHER PUBLICATIONS

D. Hadfield, Permanent Magnets and Magnetism, Iliffe Books Ltd., London, 1963, pp. 213–214.

Primary Examiner—John F. Niebling
Assistant Examiner—William T. Leader
Attorney, Agent, or Firm—Gerald J. Ferguson, Jr.; Michael P. Hoffman; Michael J. Foycik, Jr.

[57] ABSTRACT

Method and apparatus for arc evaporating a large target having a surface area of at least about 20 square inches, including a device for confining the arc to the target surface and a magnetic field source for establishing at least one magnetic field in a predetermined direction over the target surface to thus direct the cathode spot of the arc in a direction substantially perpendicular to the direction of the magnetic field and accordingly effect substantially uniform evaporation of the target by the arc where the magnetic field may be either pulsed or continuous.

39 Claims, 14 Drawing Figures

1

METHOD AND APPARATUS FOR ARC EVAPORATING LARGE AREA TARGETS

BACKGROUND OF THE INVENTION

This invention relates to arc evaporation processes and, in particular, to such processes and apparatus for arc evaporating large area targets.

The arc evaporation process is used in arc coating systems such as those disclosed in U.S. Pat. Nos. 3,625,848 and 3,836,451 to Alvin A. Snapper and U.S. Pat. Nos. 3,783,231 and 3,793,197 to L. Sablev, et. al, all of these patents being incorporated herein by reference. These systems are characterized by the use of arc guns to effect high deposition rates and other advantageous features. The arc itself involves currents of 60 amperes or more concentrated into a cathode spot so small that current densities are $10^3$ to $10^6$ amperes per square inch, the mean energy of the particles constituting the arc being typically 20-100 electron volts. The voltages are 15 to 45 volts. Thus, power densities at the tiny cathode spot are in the order of megawatts/inch$^2$. The cathode spot migrates about the target surface in a random, jerky motion where the target surface under the cathode spot flash evaporates from the intense heat. It is the evaporated target material which deposits as the coating on a substrate.

Because of this random movement of the cathode spot, targets of relatively small dimensions can be relatively uniformally eroded while coating a relatively small substrate and thus efficient target utilization is effected. However, when the substrate size is increased, a difficulty arises if one simply attempts to employ a target size greater than about 20 square inches, in that uniform erosion of the target no longer occurs, thus resulting in poor target utilization. Rectangular targets are especially poor in this regard. Thus, when large substrates are involved, multiple small sources have been heretofore employed with correspondingly larger total target area where each source constitutes an arc gun typically requiring about 60 amperes to generate at least one arc spot. The substrate heating increases proportionately to the number of spots. Thus, as the load is expanded (including the size of the substrate to be coated), there is a tendency to damage the substrate by overheating due to the large number of guns employed. Thus, although the large number of guns do provide freedom of adjustment, this approach tends to be costly both from the point of view of power supply and maintenance needs. Accordingly, a more practical approach is needed for the commercial coating of large surface areas or large racks of smaller parts.

SUMMARY OF THE INVENTION

Accordingly, it is a primary object of this invention to provide an improved method and apparatus for coating large surface areas or large racks of smaller parts.

It is a further object of this invention to provide an improved method and apparatus for arc evaporating large area targets having a surface area of at least about 20 square inches.

It is a further object of this invention to utilize the arc coating method as a method for coating metal on plastic substrates.

Other objects and advantages of this invention will be apparent from a reading of the following specification and claims taken with the drawing.

BRIEF DESCRIPTION OF THE DRAWING

FIG. 3 illustrates in plan view circuitry for applying current to the magnetic field source and FIG. 4 is a cross-sectional view taken along the line 4—4 of FIG. 3 which further illustrates the target and erosion thereof.

FIG. 5B illustrates circuitry for applying appropriate signals to the magnetic field source, FIG. 5A is a cross-sectional view taken along the line 5A—5A of FIG. 5B, and FIG. 5C diagrammatically illustrates an illustrative path of the cathode spot in the embodiment of FIGS. 5A and 5B.

DETAILED DESCRIPTION OF PREFERRED EMBODIMENTS OF THE INVENTION

Figure 1:
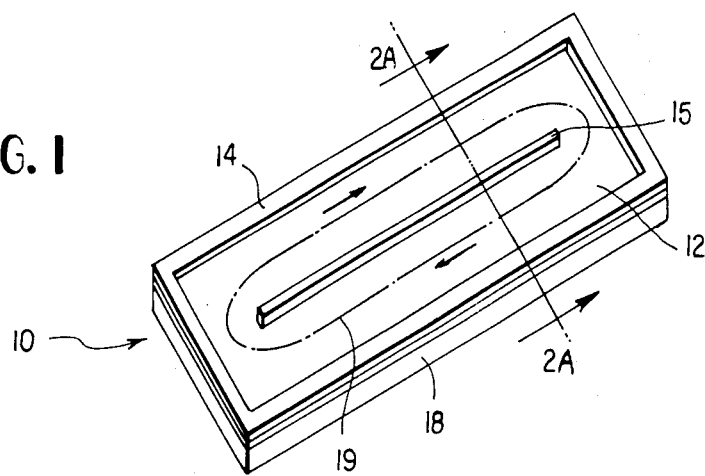
FIG. 1 is a perspective view of an illustrative pulsed magnetron arc cathode embodiment of the invention.

Reference should now be made to the drawing where like reference numerals in the Figures thereof refer to like parts.

Figure 2A:
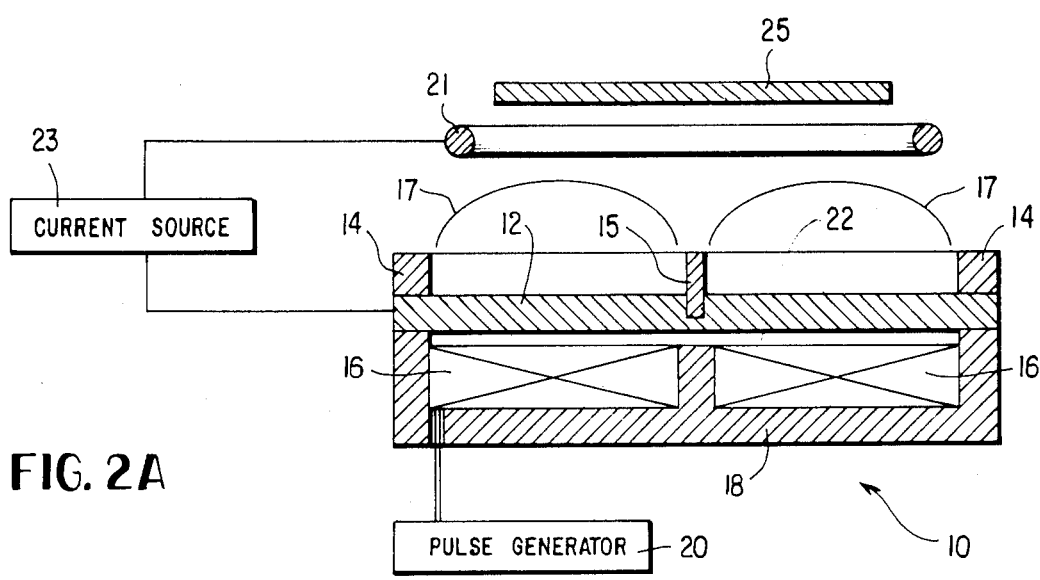
FIG. 2A is a cross-section taken on the line 2A—2A of FIG. 1.

FIGS. 1 and 2A are directed to an illustrative pulsed magnetron arc cathode 10 in accordance with the invention. A target 12 of the material to be evaporated is provided where the target must be electrically conductive such as a metal. The target 12 to be arc evaporated has disposed around the periphery thereof arc confinement means 14 which may comprise an outer rail consisting of a nitride material such as boron nitride or titanium nitride as disclosed in U.S. Pat. No. 4,430,184 or a magnetically permeable material as disclosed in U.S. patent application Ser. No. 572,007 filed Jan. 19, 1984 now U.S. Pat. No. 4,600,489. Further, the arc confinement means 14 may constitute a ground shield as disclosed in U.S. Pat. No. 3,793,179 or an anode as disclosed in U.S. Pat. No. 3,625,848. An optional inner rail 15 may be employed.

Disposed beneath target 12 is a magnetic field source 16 comprising typically a magnetic coil, the center line of the coil being indicated by phantom lines 19 in FIG. 1. The coil is disposed within a permeable coupler 18 to thereby provide a transverse magnetic field 17 over the target as illustrated in FIG. 2A.

Figure 2B:
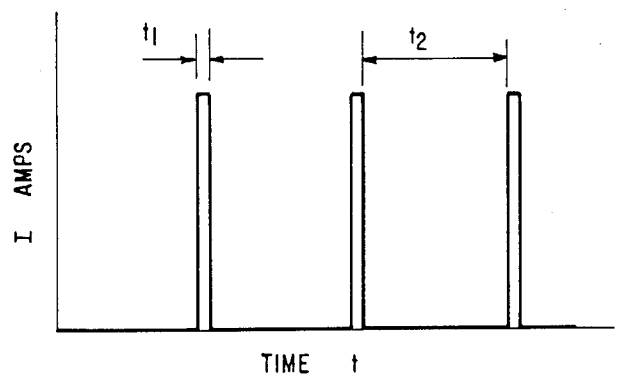
FIG. 2B is a graph of illustrative current pulses employed in the embodiment of FIG. 1.

A pulse generator 20 applies current pulses to the coil 16, illustrative pulses being illustrated in FIG. 2B. Disposed between target 12 and coil 16 is a space 22 through which means for providing a coolant such as water may extend. Diagrammatically indicated is an anode 21, there being a current source 23 connected between the anode and target 12 as is conventional in arc evaporation cathodes. As is also known, a separate cathode may be employed which would be connected to source 23 where target 12 would be disposed on the separate cathode. Also diagrammatically indicated is a substrate 25 which for purposes of the present invention is typically a large substrate where in certain applications the anode and substrate may be the same member. As discussed above, such substrates heretofore have required a plurality of arc sources to coat them. However, in accordance with the present invention, practical commercial coating of large surface areas or large racks of smaller parts is effected with a large arc target—that is, one having a surface area of at least about 20 square inches, by employing a transverse magnetic field to provide directed motion of the cathode spot(s) around the target, the field either being pulsed or continuous whereby uniform erosion of the large area targets is effected.

In operation, a so-called type 2 arc is established on target 12, after initial cleaning of the target. During initial cleaning of the target, a type 1 arc occurs which moves quite rapidly over the target. After target cleaning, the type 2 arc then moves over the target, this latter arc being the one which effects meaningful target evaporation. The type 2 arc tends to move quite slowly on the target, reportedly at a velocity of about 1 meter per second. This is a random motion, which tends to jerk in one direction and then another. Referring to FIG. 2B, the current pulses are applied to the magnetic coil 16 once the type 2 arc is established. During the non-pulse time, the arc will tend to wander randomly within arc confinement means or outer rail 14 and inner rail 15 - that is, the motion tends to be quite local and without intentional direction. During the time $t_1$ when the current pulse is applied, the transverse magnetic field 17 is established which, first, tends to center the cathode spot over the center line 19 of the coil 16 and, second, move the cathode spot a predetermined amount in the direction of the arrows shown in FIG. 1. Typically the magnetic field is present for only a tiny fraction of the total period $t_1+t_2$. Thus, most of the time is spent in random motion of the cathode spot from outer rail 14 to inner rail 15. As can be appreciated, the magnetic field is not used for containment of the arc on the target but only to provide periodic motion of the spot in the direction of the arrows. As many cathode spots as desired can be present on the target. As is known in this art, the number of spots increases depending on the amount of current provided by source 23. If a plurality of spots are present, each is given a similar jog forward by the field pulse occurring during time $t_1$. The arc should be moved often enough to guarantee uniform substrate coating. With very long cathodes 10, this may become a problem unless multiple spots are used, as stated above. Such will be needed in most cases, for the average current density must be maintained on the large target area to achieve the expected coating rate. In general, the length of the pulse, $t_1$ and the magnitude of the current will combine to establish the magnitude of the directed motion. These factors can be accordingly adjusted depending upon the particular configuration and, in particular, the length, of the target.

As shown in FIG. 1 electromagnet 16 provides a closed path; however, such a path is not critical. That is, both the random motion of the arc and the apparent avoidance of one spot for another provide a mechanism for effecting motion of the arc around the path 19 indicated in FIG. 1.

Other configurations of the magnetic field source 16 may be employed to effect the foregoing concept, including, for example, reversing spot motion direction by reversing the polarity of the output of pulsed generator 20. For example, it would be possible to spiral into the center of a large target and then reverse and spiral back out.

As stated above, inner rail 15 is optional. When employed, this rail or barrier can be very narrow—that is, about 1/16th of an inch, and retained in a shallow groove milled or cut into target 12. Thus, when employed, it need only physically block a very small region of the target. When inner rail 15 is not employed, there are very few accidental cross-overs. Very seldom does the arc cross the center line without travelling to the end of the cathode. In spite of this, there is excellent erosion in the center of the target. It is as if the arc had continuing velocity or momentum which helps deflect it back when the field is reestablished. When the visible, cathode spot does get so far across the center line that is must reverse its direction of travel, the time period is long and the turn radius large, this being further evidence the arc appears to have continuing velocity or momentum.

Figure 3:
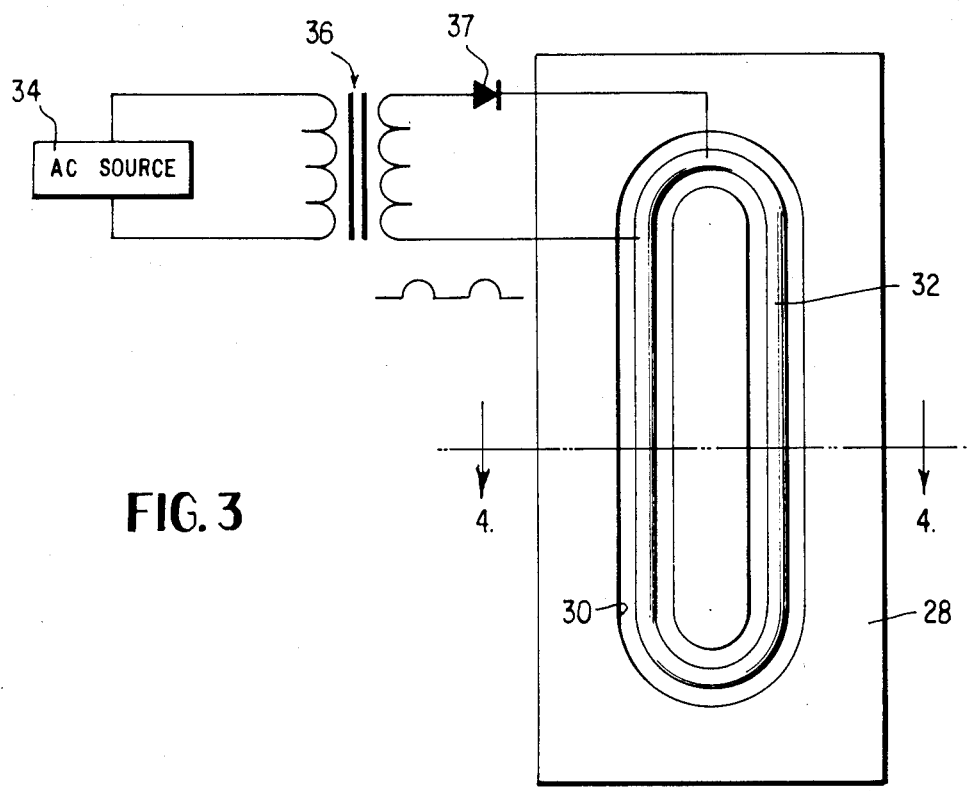
FIGS. 3 and 4 are directed to an illustrative full motion control arc cathode embodiment of the invention where
Figure 4:
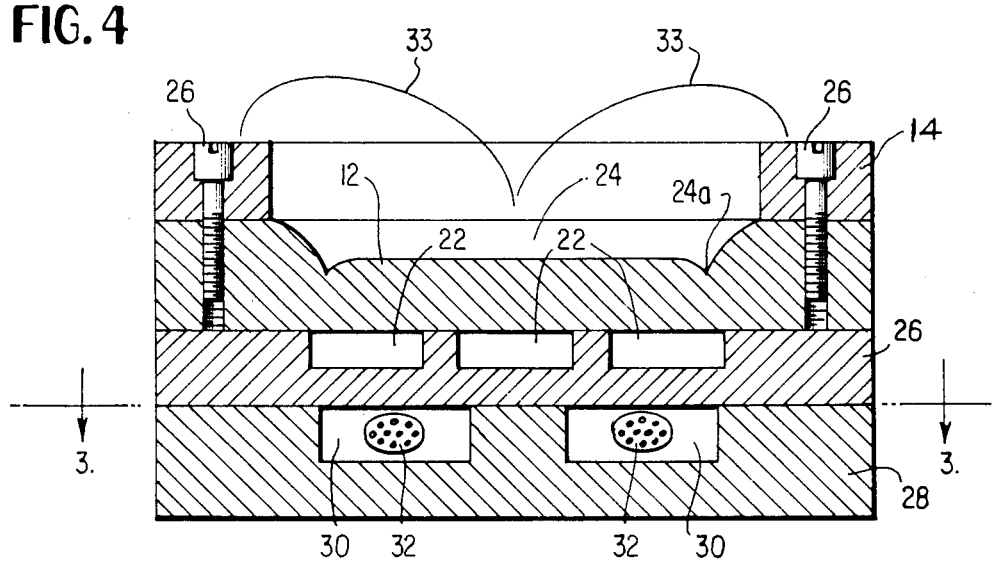

FIGS. 3 and 4 illustrate an embodiment of a pulsed magnetron arc cathode wherein the inner rail 15 of the FIG. 1 embodiment is not employed. The outer arc confinement means 14 includes means diagrammatically indicated at 26 for clamping outer rail 14 or target 12 within the structure as is conventional. The magnetic field source comprises a permeable coupler such as iron plate 28 having an oval-shaped recess 30 therein and a coil 32 disposed within the recess, the coil typically including 50 to 200 turns of magnet wire made of copper, for example. As shown in FIG. 3, means for supplying current to the respective ends of coil 32 include an AC source 34 coupled to a transformer 36, which may be a filament transformer having a 6.3 volt output. A rectifier 37 is connected in the secondary circuit of the transformer where the respective ends of the secondary winding are connected to the respective ends of coil 32. Thus, a single wave rectified sine wave is applied to the coil, as illustrated in FIG. 3. This wave form is approximately as effective as the wave form of FIG. 2B. The adjustment of both the power of coil 32 and the current supplied from current source 23 (see FIG. 2A) effect the speed of the cathode spot.

In operation, AC source 34 is turned on after initial target cleaning. During the off-time of the rectified AC input, random motion of the spot occurs while during the on-time, magnetic field 33 is established to effect intermittent directed motion of the spot around the target in a manner similar to that discussed with respect to the FIG. 1 embodiment. In a tested unit, the erosion pattern width approximated that which is illustrated at 24 in FIG. 4. Deeper erosion occurred at area 24a, this area being over the coil. This deeper erosion was caused by the sine wave drive which, when on, return the spot to the center line over source 32 for too large a fraction of the time. That is, by analogy with respect to FIG. 2B, the period t₁ was too long. Placing coil 32 sufficiently far from the center that its center falls about one-quarter inch from the inner edge of rail 14 provides excellent target utilization and minimizes the effect caused by the sine wave drive.

Figure 5B:
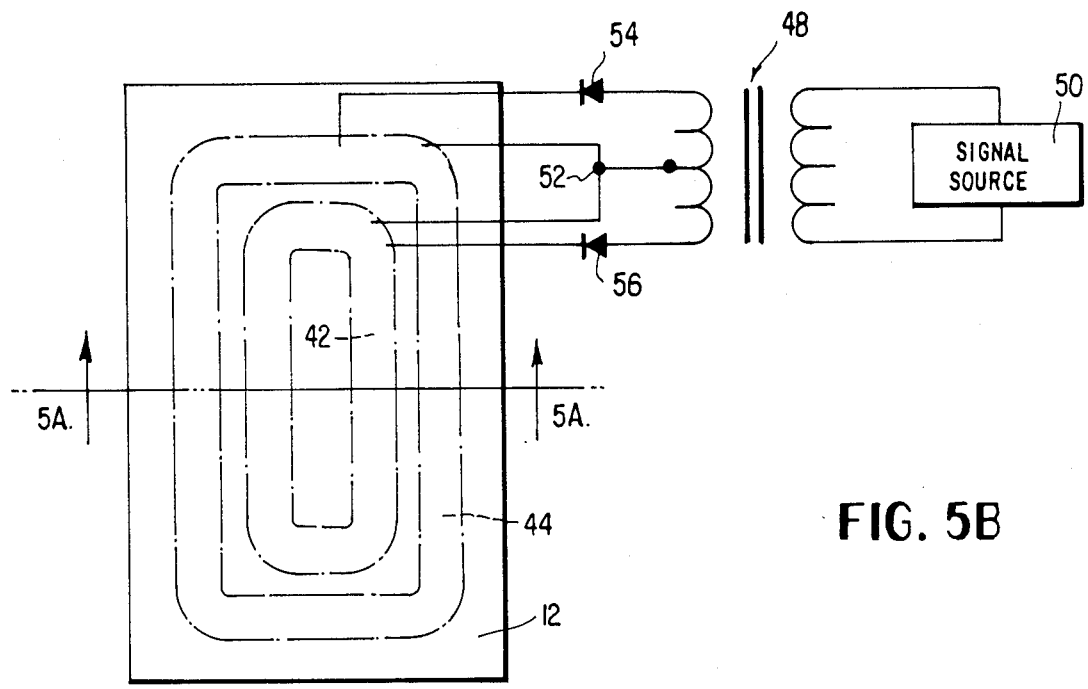
FIGS. 5A, 5B and 5C are directed to another illustrative full motion control arc cathode embodiment where
Figure 5A:
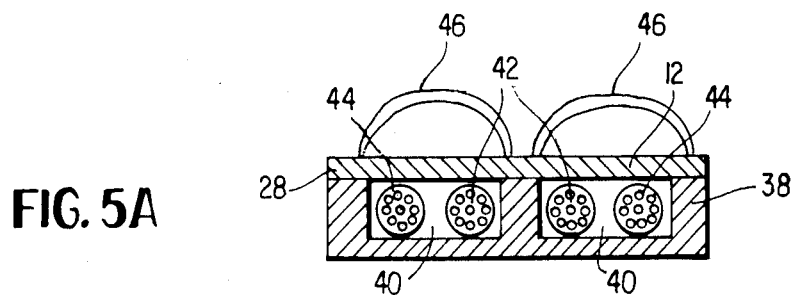

The embodiment of FIGS. 5A and 5B is that of a full motion control arc cathode as opposed to the pulsed magnetron arc cathodes described hereinbefore. The magnetic field is continuously applied in a full motion control arc cathode while it is pulsed on and off in a pulsed magnetron arc cathode. Although not shown in FIG. 5A, and certain other Figures of the drawing, the target 12 would include arc confinement means 14 for retaining the arc on the surface of the target. Disposed beneath target 12 is a magnetic field source which comprises magnetic coils 42 and 44, the coil 42 being concentrically disposed within the coil 44. Each of the coils typically comprises 50 to 200 turns of magnet wire. In FIG. 5B there is shown circuitry for applying current to coils 42 and 44, this circuitry including a signal source 50 which may provide an AC current or a square wave output. This signal is applied through transformer 48, the secondary of which includes a center tap 52. Rectifiers 54 and 56 may be connected to the respective ends of the secondary winding, if source 50 provides an AC output. Thus, assuming the source 50 output is AC, connected to the respective ends of coil 42 are center tap 52 and the cathode of rectifier 56 while connected to the respective ends of coil 44 are center tap 52 and the cathode of rectifier 54. Of course, the polarity of the rectifiers as shown is illustrative and both may have the polarities thereof reversed if so desired.

Figure 5C:
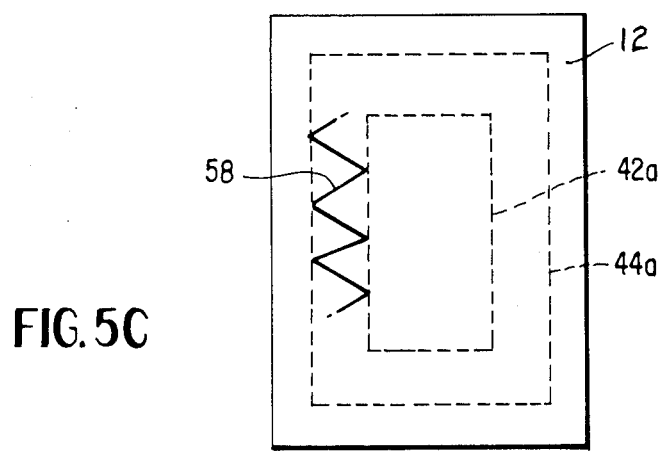

Before proceeding with a description of the operation of the cathode of FIGS. 5A and 5B, it should be noted the pulsed magnetron arc cathode provides random wander with periodic moments of forced motion around the track. Moreover, the pulsed magnetron field provides a centering force directly over the drive coil as well as a push around the track. This principle is used in the full motion control arc cathode of FIGS. 5A and 5B where coil 42 constitutes an inner pulsed coil while coil 44 constitutes an outer pulsed coil such that the magnet center (and thus the cathode spot) is moved inward and outward depending on which of the coils is energized. The inner and outer coils are alternately energized by alternate half cycles of the signals applied from source 50. Thus, the arc is moved around the track with periodic pulses but it is also moved back and forth, as illustrated in FIG. 5C at 58, from the inner coil center 42a to the outer coil center 44a. The magnetic field components that move the arc back and forth, sideways are weaker than those that move forward. Thus, free wander may be included to even further widen the pattern.

The drive period over each of the coils 42a and 42b should be just long enough for the arc to move the field center over that coil. If it is there longer, there will be excess erosion directly over the coils. It is desirable that the field of each coil cover the entire target such that the arc is always under the magnetic dome 46. As long as perfect synchronization between coil drive and arc/-target rotational position does not occur, there will be a uniform erosion around the track. Depending upon target size and drive parameters, the arc motion from one field center to the other may even take several trips around the track, rather than as shown in FIG. 5c.

Figure 6:
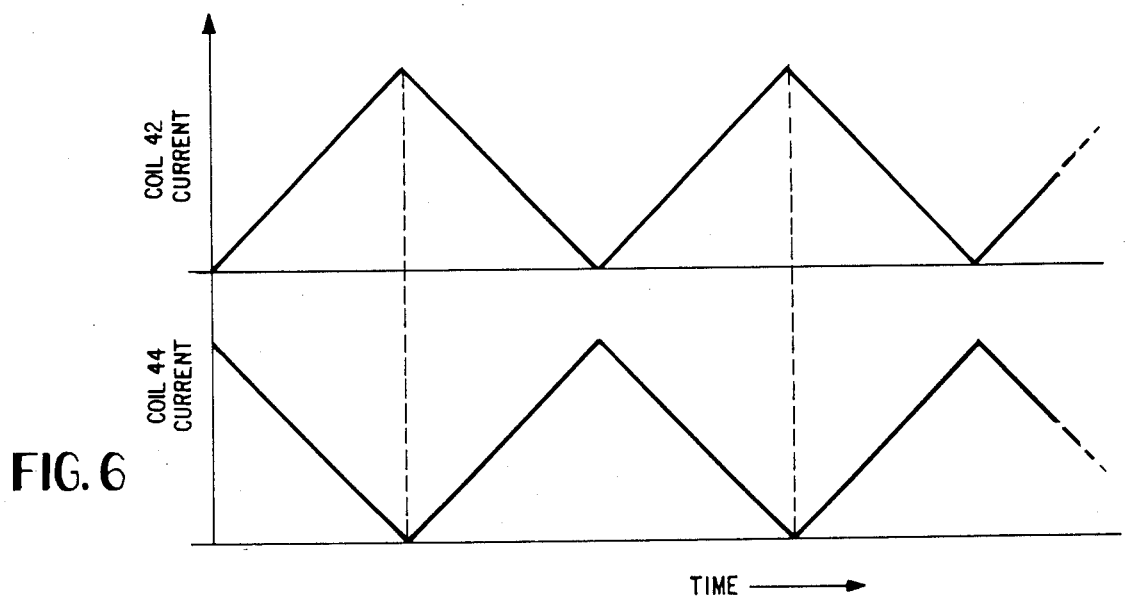
FIG. 6 is a graph of illustrative wave forms which may also be employed in the embodiment of FIGS. 5A and 5B in accordance with the invention.

Experimental verification of the two coil, full motion control arc cathode of FIGS. 5A and 5B was done with sine waves. In both sine wave and square wave drives for the two coil system, there is some criticality of timing for best results. The arc should not remain in a fixed track but rather oscillate back and forth between two stable tracks. Full control can be established by never having both coils off at the same time. Various specially tailored wave forms can thus be employed to maximize erosion uniformity. Illustrative, specially tailored, triangular-shaped waves are illustrated in FIG. 6 which shows the drive relationship between the waves. When coil 42 is full power, coil 44 is off. As coil 42 decreases in applied current, the current applied to coil 44 increases and visa versa. Thus, the center of the transverse magnetic field moves smoothly back and forth between the two coils. The arc (or cathode spot) follows this field center and thus also moves back and forth while being driven around the track. Thus, the embodiment of FIGS. 5A and 5B effects full control of the arc to sweep it back and forth around the track. Control is never released. The arc can be moved much faster in this embodiment for there is no longer a need to superimpose random wander on the forward motion to insure erosion of the entire coil 42 to coil 44 portion of target 12.

Figure 7:
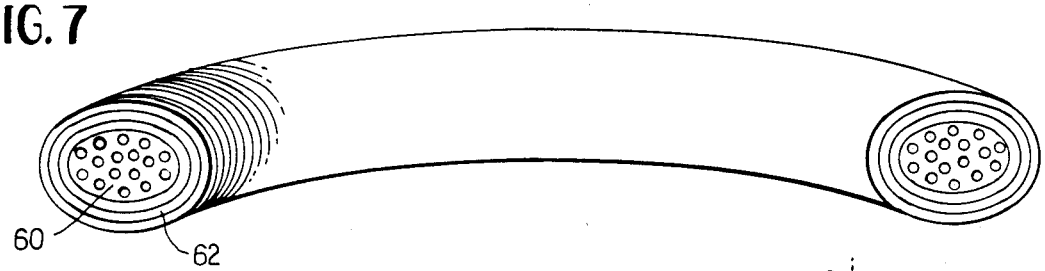
FIG. 7 is a diagrammatic illustration of a further magnetic field source for a full motion control arc cathode in accordance with the invention.

FIG. 7 illustrates a further illustrative embodiment of a magnetic field source for use in a full motion control arc cathode. In particular, a continuous forward motion field is employed with an oscillating side/center directed gradient. Thus, the coil of FIG. 7 is a composite having a first longitudinally extending coil 60 corresponding to either the coils 42 and 44 of the embodiment of FIGS. 5A and 5B or the coil 32 of FIG. 4. A second coil 62 is wound perpendicular to forward motion coil 60, an oscillating current being applied thereto. Continuous direct current is applied to forward motion coil 60 and thus in this sense the arc cathode may be considered an arc magnetron. The oscillating side/center directed gradient is provided by driving coil 62. This embodiment would tend to be more critical than that of FIGS. 5A, 5B since coils 60 and 62 interact in establishing the maximum amount of motion of the arc.

Before discussing the remaining embodiments of the invention, it should be noted in the embodiment of FIGS. 1 and 3, large area cathodes are eroded by intermittent arc propulsion around the cathode or target. In the embodiments of FIGS. 5A, 5B continuous arc motion is provided back and forth between concentric alternately appearing magnetron fields. In the embodiment of FIG. 7, a continuous forward field is established by continuously driving coil 60 and thus this embodiment may possibly be considered an arc magnetron. In the remaining embodiments of the invention, other full motion control arc cathodes are described which utilize various magnetron fields of a continuous but complex sort. These, quite often, provide less restrictions in effecting uniform erosion of large target areas of rectangular or irregular shape.

There are a number of literature references to the behavior of a vacuum arc in the presence of a transverse magnetic field. One of these is the article by Keseav and Pashakova entitled "The Electromagnetic Anchoring of the Cathode Spot", Soviet Physics-Technical Physics, Volume 4, page 254 (1959). Because their work was on a mercury cathode, the erosion profile was not a factor nor, of course, uniformity of erosion thereof, which is an important consideration in the subject invention. Moreover, in a number of the prior art studies, the magnetron field is momentary and the arc lifetime is fleeting. Furthermore, the continuous magnetron field has not been applied in an effective manner to a vacuum coating application of arc evaporation in that the field coil is typically placed outside the target area such as in the above mentioned U.S. Pat. No. 3,836,451. Thus, the transverse portion of the field that occurs over the coil is not over the target.

If a sufficiently strong magnetron field is employed to guarantee containment of a type 2 arc, the erosion section is narrow. However, as the field magnitude is reduced to a level of marginal containment, a much wider, more "V" shaped erosion pattern has been observed by the applicant. Study of pulsed and continuous weak field behavior has led applicant to increase the field until a directional velocity of about 20 to 30 inches per second is observed when rail 14 comprises a permeable material. Velocities considerably less than about 20 inches per second can become unstable, showing no obvious short term tendency to move around the target in a directed manner. In general, the strength of the magnetic field at the surface of target 12 should be at least about three gauss when rail 14 is permeable while it should be at least about one gauss when a non-permeable means is employed to effect arc confinement although it should be understood magnetic strengths less than the above values can be employed with varying degrees of success depending on the type of magnetic field source employed and the degree of erosion uniformity needed.

Figure 8:
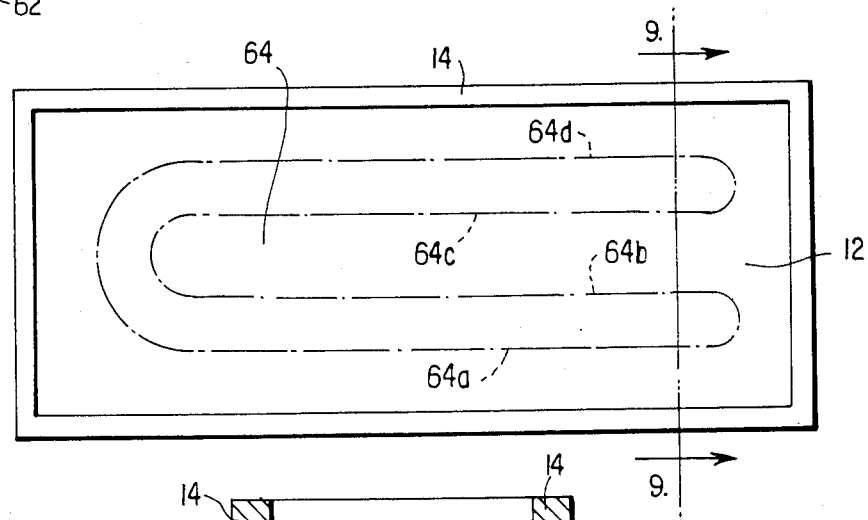
FIGS. 8 and 9 are directed to a further illustrative embodiment of a full motion control arc cathode in accordance with the invention where FIG. 8 diagrammatically indicates in plan view the location of the magnetic field source with respect to the target and FIG. 9 is a cross-section taken on the line 9—9 of FIG. 8.
Figure 9:
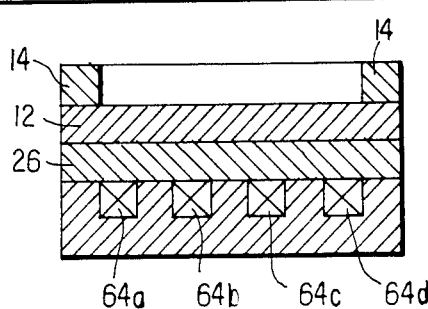

The remaining embodiments of this invention employ reverse polarity adjacent sections of magnetic field to advantage in more complex arrangements. Referring to FIGS. 8 and 9, there is illustrated a coil 64 which is configured in a generally U-shaped configuration including 4 separate linear sections 64a through 64d where the current flow in adjacent sections is opposite in direction to thereby provide reverse polarity adjacent sections of magnetic field. The erosion pattern from each section tends to be a round bottomed "V", the width of which is rather narrow even at rather low coil power. The linear sections are placed sufficiently close to one another that the resulting V-shaped erosion patterns generated therefrom overlap whereby their summation provides substantially uniform target erosion. Thus, by adjusting the spacing of sections 64a through 64d and employing sufficiently low coil current, a substantially uniform target erosion will be effected. Use of full wave rectified AC to drive coil 64 can provide short periods of arc wander, but keep the cathode spot or spots on the correct tracks. The coil configuration of FIGS. 8 and 9 has been employed with a rectangular target of 5 inch×12 inch dimensions. A constant, filtered DC current may also be employed in coil 64. In this case, the system generally corresponds to a fixed magnet system similar to a sputtering magnetron but many times weaker.

Figure 10:
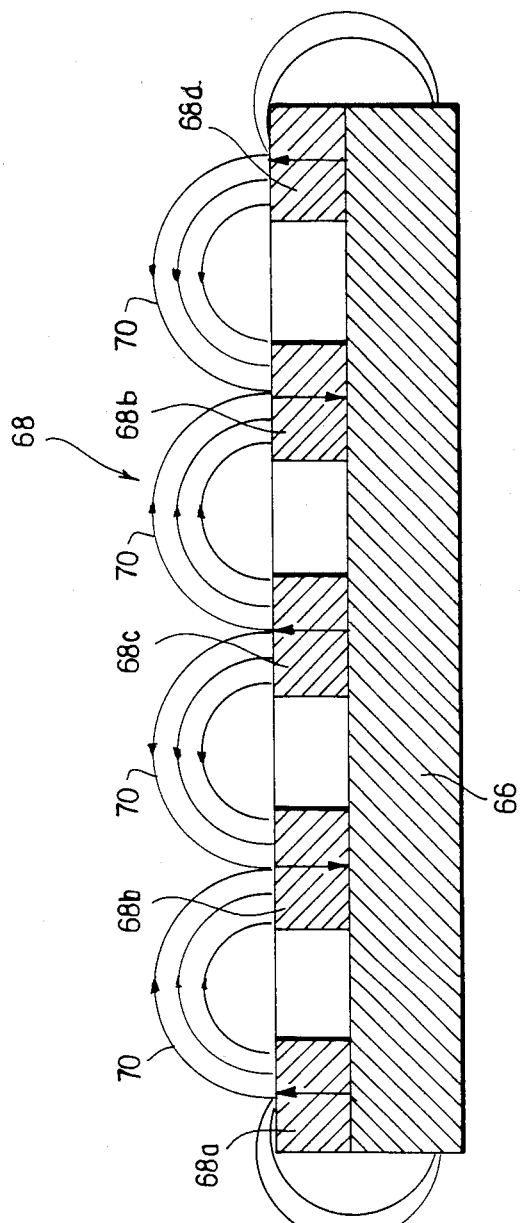
FIG. 10 is a cross-sectional view which diagrammatically indicates another embodiment of a magnetic field source for a full motion control arc cathode.
Figure 11:
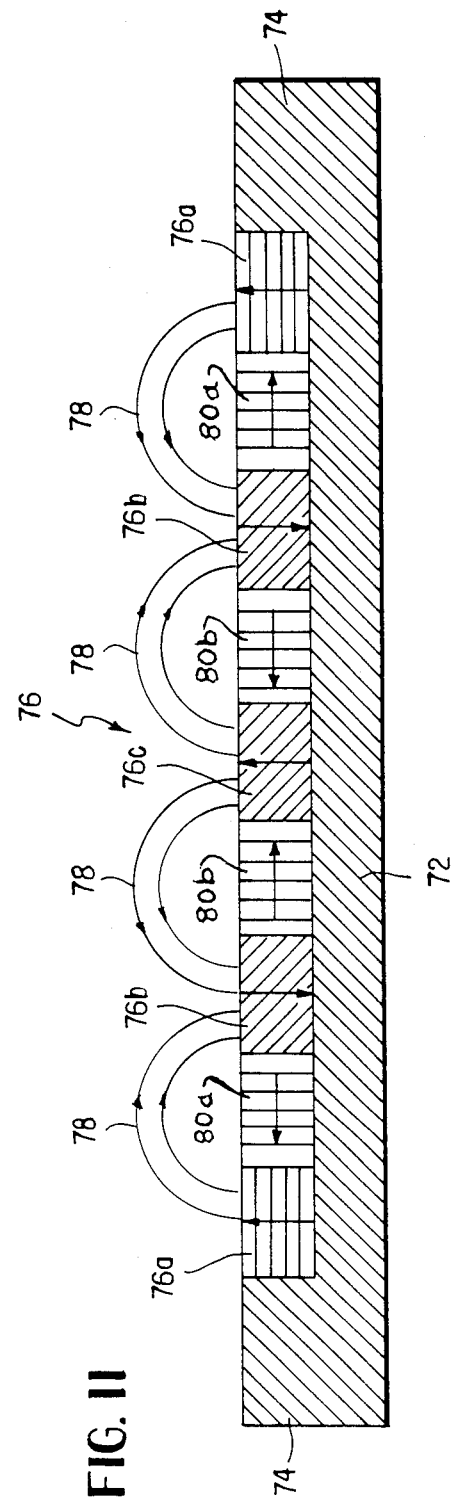
FIG. 11 is a cross-sectional view which diagrammatically indicates yet another illustrative magnetic field source for use with a full motion control arc cathode in accordance with the invention.

A fixed magnet system for use in an arc cathode is illustrated in FIG. 10 and includes a permeable back plate 66 and magnets 68a through 68c where the polarization of adjacent magents is in opposite directions as indicated by the arrows. Hence, again reverse polarity adjacent sections of magnetic field are established, these fields being indicated at 70. The required field strength is only a few gauss; however, to utilize a thick target 12 (which, of course, would be disposed above the magnetic field source shown in FIG. 10) for long operation periods without target change, the field must be projected to a considerable height. This can be effected by the embodiment of FIG. 11 where magnets 80a and 80b added to the FIG. 10 embodiment assist in providing upward field projection. Permanent magnets 76a through 76c and 80a, 80b may consist of conventional magnet materials or flexible permanent magnet materials such as those described in U.S. Pat. No. 4,265,729, which patent is incorporated herein by reference. Moreover, solid ferrite magnets may also be employed as the above magnets.

From the foregoing it can be seen a number of different pulsed and continuous techniques have been employed which make practical the arc evaporation of large targets. Magnetron fields have been employed in the past by Keseav in vacuum arc applications; however, the magnetron field was used to retain the arc on the target for coating applications. This was effected by the use of one turn of the power line behind the target. However, there was no suggestion of using a magnetron field by Keseav with a large target to thereby facilitate uniform erosion thereof. Furthermore, there was no suggestion by Keseav to use an arc confinement means in addition to a separate means for directing the cathode spot over the target surface. Moreover, there is no suggestion in the prior art of the variations described herein and below for effecting a uniform erosion of large, arc evaporated targets:

1. Use of weak, but complex magnetron fields as illustrated and discussed with respect to FIGS. 8 through 11, to effect near uniform erosion of the large target surface by electromagnets or permanent magnets. Such magnetron fields may be unique in form such that a simple "V" type "race track" erosion is partially overlapped with adjacent erosion patterns of the same type.

2. Use of pulsed magnetron systems whether single or multiple-track including directed arc motion and possible random wander, as illustrated and discussed with respect to FIGS. 1 through 7.

3. Use of multiple coil or permanent magnet plus coil systems for shifting the magnetic field center over the target surface. A somewhat analogous type of control for sputter coating is disclosed in U.S. Pat. No. 3,956,093, which is incorporated herein by reference.

4. Use of mechanical motion of coils or fixed magnets influencing magnetic fields at the arc target, a somewhat analogous type of control for sputter coating being disclosed in U.S. Pat. No. 3,878,085, which is incorporated herein by reference.

5. Use of mechanical motion of the arc relative to the magnetic system including permeability, a somewhat analogous type of control for sputter coating being disclosed in U.S. Pat. No. 4,356,073, which is incorporated herein by reference.

There has thus been described in detail illustrative embodiments for the arc evaporation of large targets. It should be understood, of course, numerous changes in details of construction, arrangement and operation may be effected without departing from the spirit of the invention, especially as defined in the appended claims.

What is claimed is:

1. Arc evaporating apparatus comprising:
   a target having a surface of material to be evaporated, the surface having an area of at least about 20 square inches;
   means for establishing an arc on the target surface for evaporating the target material, the arc being characterized by the presence of charged particles and a cathode spot which tends to randomly migrate over the target surface;

cathode spot directing means including magnetic field source means for establishing at least one closed loop magnetic field over said target surface to thereby direct said cathode spot around a closed loop path on said target surface, said closed loop path being defined by said closed loop magnetic field, said magnetic field source means being disposed under said target on the side of the target opposite the side thereof having said surface of material to be evaporated said cathode spot directing means including means for intermittently turning said closed loop magnetic field on and off to thus effect substantially uniform evaporation of the target by the arc; and means for confining the arc to the target surface.

2. Arc evaporating apparatus comprising:

a target having a surface of material to be evaporated;

means for establishing an arc on the target surface for evaporating the target material, the arc being characterized by the presence of charged particles and a cathode spot which tends to randomly migrate over the target surface;

means for confining the arc to the target surface; and cathode spot directing means including magnetic field means for establishing at least one closed loop magnetic field over said target surface to thereby direct said cathode spot around a closed loop path on said target surface, said closed loop path being defined by said closed loop magnetic field, said magnetic field source means being disposed under said target on the side of the target opposite the side thereof having said surface of material to be evaporated, said cathode spot directing means including means for intermittently turning said closed loop magnetic field on and off to thus effect substantially uniform evaporation of the target by the arc.

3. Apparatus as in claim 2 where said target surface has an area of at least 20 square inches.

4. Arc evaporating apparatus comprising:

a target having a surface of material to be evaporated, the surface having an area of at least about 20 square inches;

means for establishing an arch on the target surface for evaporating the target material, the arc being characterized by the presence of charged particles and a cathode spot which tends to randomly migrate over the target surface;

cathode spot directing means including magnetic field source means for intermittently establishing at least one closed loop magnetic field over said target surface to thereby direct said cathode spot around a closed loop path on said target surface, said closed loop path being defined by said closed loop magnetic field and said magnetic field source means including (a) electromagnet means disposed under said target on the side of the target opposite the side thereof having said surface of material to be evaporated and (b) a current source for applying half wave rectified current to the electromagnet means to thus effect substantially uniform evaporation of the target by the arc; and means for confining the arc to the target surface.

5. Arc evaporating apparatus comprising:

a target having a surface of material to be evaporated;

means for establishing an arc on the target surface for evaporating the target material, the arc being characterized by the presence of charged articles and a chathode spot which tends to randomly migrate over the target surface;

means for confining the arc to the target surface; and cathode spot directing means including magnetic field source means for intermittently establishing at least one closed loop magnetic field over said target surface to thereby direct said cathode spot around a closed loop path on said target surface, said closed loop path being defined by said closed loop magnetic field and said magnetic field source means including (a) electromagnet means disposed under said target on the side of the target opposite the side thereof having said surface of material to be evaporated and (b) a current source for applying half wave rectified current to the electromagnet means to thus effect substantially uniform evaporation of the target by the arc.

6. Apparatus as in claim 5 where said target surface has an area of at least about 20 square inches.

7. Apparatus as in claims 4 or 5 where said electromagnet means comprises a coil including a plurality of turns of magnet wire and having respective ends and where said current source is connected to said respective ends.

8. Arc evaporating apparatus comprising:

a target having a surface of material to be evaporated, the surface having an area of at least about 20 square inches;

means for establishing an arc on the target surface for evaporating the target material, the arc being characterized by the presence of charged particles and a cathode spot which tends to randomly migrate over the target surface;

cathode spot directing means including magnetic field source means for intermittently estalishing at least one closed loop magnetic field over said target surface to thereby direct said cathode spot around a closed loop path on said target surface, said closed loop path being defined by said closed loop magnetic field and said magnetic field source means including (a) electromagnet means disposed under said target on the side of the target opposite the side thereof having said surface of material to be evaporated and (b) a current source for applying current pulses to the electromagnet means such that during the duration of each pulse the cathode spot is moved along said closed loop path while during the interval between pulses, the cathode spot randomly wanders over the target surface to thus effect substantially uniform evaporation of the target by the arc; and means for confining the arc to the target surface.

9. Arc evaporating apparatus comprising:

a target having a surface of material to be evaporated;

means for establishing an arc on the target surface for evaporating the target material, the arc being characterized by the presence of charged particles and a cathode spot which tends to randomly migrate over the target surface;

means for confining the arc to the target surface; and cathode spot directing means including magnetic field source means for intermittently establishing at least one closed loop magnetic field over said target surface to thereby direct said cathode spot around a closed loop path on said target surface, said closed loop path being defined by said closed loop magnetic field and said magnetic field source means including (a) electromagnet means disposed under said target on the side of the target opposite the side thereof having said surface of material to be evaporated and (b) a current source for applying current pulses to the electromagnet means such that during the duration of each pulse the cathode spot is moved along said closed loop path while during the interval between pulses, the cathode spot randomly wanders over the target surface to thus effect substantially uniform evaporation of the target by the arc.

10. Apparatus as in claim 9 where said target surface has an area of at least about 20 square inches.

11. Arc evaporating apparatus comprising:
a target having a surface of material to be evaporated, the surface having an area of at lest about 20 square inches;
means for establishing an arc on the target surface for evaporating the target material, the arc being characterized by the presence of charged particles and a cathode spot which tends to randomly migrate over the target surface;
cathode spot directing means including magnetic field source means for at least intermittently establishing at least one closed loop magnetic field over said target surface to thereby direct said cathode spot around a closed loop path on said target surface, said closed loop path being defined by said closed loop magnetic field and said magnetic field source means including electromagnet means disposed under said target on the side of the target opposite the side thereof having said surface of material to be evaporated where said electromagent means comprises two concentrically disposed coils where each coil includes a plurality of turns of magnet wire and said apparatus includes a current source which delivers out-of-phase signals to the respective coils, whereby the coils are alternately energized and the cathode spot is successivley moved from the center line over one of the coils to the center line over the other coil such that substantially continuous control is exercised over the motion of the cathode spot as it is moved around the target surface to thus effect substantially uniform evaporation of the target by the arc; and
means for confining the arc to the target surface.

12. Arc evaporating apparatus comprising:
a target having a surface of material to be evaporated;
means for establishing an arc on the target surface for evaporating the target material, the arc being characterized by the presence of charged particles and a cathode spot which tends to randomly migrate over the target surface;
means for confining the arc to the target surface; and
cathode spot directing means including magnetic field source means for at least intermittently establishing at least one closed loop magnetic field over said target surface to thereby direct said cathode spot around a closed loop path on said target surface, said closed loop path being defined by said closed loop magnetic field and said magnetic field source means including electromagnet means disposed under said target on the side of the target opposite the side theroef having said surface of material to be evaporated where said electromagnet means comprises two concentrically disposed coils where each coil includes a plurality of turns of magnet wire and said apparatus includes a current source which delivers out-of-phase signals to the respective coils, whereby the coils are alternately energized and the cathode spot is successively moved from the center line over one of the coils to the center line over the other coil such that substantially continuous control is exercised over the motion of the cathode spot as it is moved around the target surface to thus effect substantially uniform evaporation of the target by the arc.

13. Apparatus as in claim 12 where said target surface has an area of at least about 20 square inches.

14. Apparatus as in claims 11 or 12 where the wave forms of the signals respectively applied to the two coils are triangular in configuration such that, when the current applied to one of the coils is increasing, the current to the other coil is decreasing and visa versa, whereby at least some current is applied to each of the coils at all times.

15. Apparatus as in claims 11 or 12 where the out-of-phase signals are derived from alternate half-wave cycles of an AC signal.

16. Apparatus as in claims 11 or 12 where said arc confining means is a rail extending around the periphery of the target surface, the rail being composed of a magnetically permeable material.

17. Apparatus as in claim 16 where the strength of said magnetic field at said target surface is at least about three gauss.

18. Apparatus as in claim 16 including an inner rail extending along a central portion of the target surface.

19. Apparatus as in claims 11 or 12 where said arc confining means is a rail extending around the periphery of the target surface, the rail being composed of a nitride material selected from the group consisting of boron nitride or titanium nitride.

20. Apparatus as in claim 19 where the strength of said magnetic field at said target surface is at least about one gauss.

21. Apparatus as in claim 19 including an inner rail extending along a central portion of the target surface.

22. Apparatus as in claims 11 or 12 where the strength of said magnetic field at the target surface is at least about one gauss.

23. Arc evaporating apparatus comprising:
a target having a surface of material to be evaporated, the surface having an area of at least about 20 square inches;
means for establishing an arc on the target surface for evaporating the target material, the arc characterized by the presence of charged particles and a cathode spot which tends to randomly mirgrate over the target surface;
cathode spot directing means including magnetic filed source means for at least intermittently establishing at least one closed loop magnetic field over said target surface to thereby direct said cathode spot around a closed loop path on said target surface, said closed loop path being defined by said closed loop magnetic field and said magnetic field source means including electromagnet means disposed under said target on the side of the target opposite the side thereof having said surface of material to be evaporated where said electromagnet means includes at least a first coil including a plurality of turns where the turns extend substantially in the same direction as said directed motion of the cathode spot and a second coil wound on the first coil including a further plurality of turns where the plane of each turn of the second coil is substantially perpendicular to the turns of the first coil to thus effect substantially uniform evaporation of the target by the arc; and means for confining the arc to the target surface.

24. Arc evaporating apparatus comprising:
a target having a surface of material to be evaporated;
means for establishing an arc on the target surface for evaporating the target material, the arc being characterized by the presence of charged particles and a cathode spot which tends to randomly migrate over the target surface;
means for confining the arc to the target surface; and
cathode spot directing means including magnetic field source means for at least intermittently establishing at lest one closed loop magnetic field over said target surface to thereby direct said cathode spot around a closed loop path on said target surface, said closed loop path being defined by said closed loop magnetic field and said magnetic field source means including electromagnet means disposed under said target on the side of the target opposite the side thereof having said surface of material to be evaporated where said electromagnet means includes at least a first coil including a plurality of turns where the turns extend substantially in the same direction as said directed motion of the cathode spot and a second coil wound on the first coil including a further plurality of turns where the plane of each turn of the second coil is substantially perpendicular to the turns of the first coil to thus effect substantially uniform evaporation of the target by the arc.

25. Apparatus as in claim 24 where said target surface has an area of at least about 20 square inches.

26. Apparatus as in claims 23 or 24 where continuous DC current is applied to said first coil and an oscillating current is applied to the second coil whereby the DC current provides continuous drive of the cathode spot around the target surface while the oscillating current provides a field which oscillates the cathode spot back and forth about the direction provided by the continuous drive.

27. Arc evaporating apparatus comprising:
a target having a surface of material to be evaporated, the surface having an area of at least about 20 square inches;
means for establishing an arc on the target surface for evaporating the target material, the arc being characterized by the presence of charged particles and a cathode spot which tends to randomly migrate over the target surface;
cathode spot directing means including magnetic field source means for at least intermittently establishing at least one closed loop magnetic field over said target surface to thereby direct said cathode spot around a closed loop path on said target surface, said closed loop path being defined by said closed loop magnetic field and said magnetic field source means being disposed under said target on the side of the target opposite the side thereof having said surface of material to be evaporated where said cathode spot directing means includes means for establishing a plurality of reverse polarity adjacent sections of magnetic field over said target surface to thus effect substantially uniform evaporation of the target by the arc; and
means for confining the arc to the target surface.

28. Arc evaporating apparatus comprising:
a target having a surface of material to be evaprated;
means for establishing an arc on the target surface for evaporating the target material, the arc being characterized by the presence of charged particles and a cathode spot which tends to randomly migrate over the target surface;
means for confining the arc to the target surface; and
cathode spot directing means including magnetic field source means for at least intermittently establishing at least one closed loop magnetic field over said target surface to therby direct said cathode spot around a closed loop path on said target surface, said closed loop path being defined by said closed loop magnetic field and said magnetic field source means being disposed under said target on the side of the target opposite the side thereof having said surface of material to be evaporated where said cathode spot directing means includes means for establishing a plurality of reverse polarity adjacent sections of magnetic field over said target surface to thus effect substantially uniform evaporation of the target by the arc.

29. Apparatus as in claim 28 where said target surface has an area of at least about 20 square incehes.

30. Apparatus as in claims 28 or 29 where said means for establishing a plurality of reverse polarity adjacent sections of magnetic field includes an electromagnetic means including a coil of substantially U-shaped configuration having a plurality of parallel, substantially linear segments disposed adjacent one another wherein the current in the adjacent segments is opposite directions whereby said reverse polarity adjacent sections of magnetic field are provided over the target surface.

31. Apparatus as in claim 30 where the erosion path associated with each of said linear segments is essentially V-shaped such that the V-shaped associated with each linear segment partially overlaps the V-shapes associated with adjacent linear segments to effect said substantially uniform evaporation of the target.

32. Apparatus as in claims 27 or 28 where said means for establishing the reverse polarity adjacent sections includes a plurality of permanent magnets and/or electromagnets.

33. Apparatus as in claim 2 where the polarity of at least some of said magnets is substantially perpendicular to said target surface.

34. Apparatus as in claim 33 including further magnets disposed between said plurality of magnets, at least some of said further magnets having their polarity substantially perpendicular to the polarity of the first mentioned magnets to thereby enhance projection of the magnetic field over the target surface.

35. Apparatus as in claim 32 where said magnets are coupled by a permeable back plate.

36. Apparatus as in claim 32 where said permanent magnets comprise ferrite magnets or layers of flexible permanent magnet material.

37. Arc evaporating method comprising the steps of:
providing a target having a surface of material to be evaporated, the surface having an area of at least about 20 square inches;
establishing an arc on the target surface for evaporating the target material, the arc being characterized by the presence of charged particles and a cathode spot which tends to randomly migrate over the target surface; and
providing magnetic field source means for intermittently turning on and off at least one closed loop magnetic field over said target surface to thereby direct said cathode spot around a closed loop path on said target surface, said closed loop path being defined by said closed loop magnetic field and said magnetic field source means being disposed under said target on the side of the target opposite the side thereof having said surface of material to be evaporated, said intermittent turning on and off of the magnetic field being such that each time the field is turned on the cathode spot is moved along said closed loop path and each time it is turned off, the cathode spot randomly wanders over the target surface to thus effect substantially uniform evaporation of the target by the arc; and confining the arc to the target surface.

38. Arc evaporating method comprising the steps of:

providing a target having a surface of material to be evaporated;

establishing an arc on the target surface for evaporating the target material, the arc being characterized by the presence of charged particles and a cathode spot which tends to randomly migrate over the target surface;

confining the arc to the target surface; and providing magnetic field source means for intermittently turning on and off at least one closed loop magnetic field over said target surface to thereby direct said cathode spot around a closed loop path on said target surface, said closed loop path being defined by said closed loop magnetic field and said magnetic field source means being disposed under said target on the side of the target opposite the side thereof having said surface of material to be evaporated, said intermittent turning on and off of the magnetic field being such that each time the field is turned on the cathode spot is moved along said closed loop path and each time it is turned off, the cathode spot randomly wanders over the target surface to thus effect substantially uniform evaporation of the target by the arc.

39. A method as in claims 37 or 38 including providing a plastic substrate and where said target surface is metallic such that a metallic coating is evaporated on said plastic substrate.

* * * * *